(12) United States Patent
Ambrosio et al.

(10) Patent No.: US 10,024,893 B2
(45) Date of Patent: Jul. 17, 2018

(54) AUTOMATIC MEASUREMENT AND NOTIFICATION OF ELECTRICAL LEVEL USING SMARTPHONE SENSORS

(71) Applicant: INTERNATIONAL BUSINESS MACHINES CORPORATION, Armonk, NY (US)

(72) Inventors: Ronald Ambrosio, Poughquag, NY (US); Younghun Kim, White Plains, NY (US); Tarun Kumar, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/658,700

(22) Filed: Jul. 25, 2017

(65) Prior Publication Data
US 2017/0315162 A1    Nov. 2, 2017

Related U.S. Application Data

(63) Continuation of application No. 15/075,488, filed on Mar. 21, 2016.

(51) Int. Cl.
| | | |
|---|---|---|
| G08B 21/00 | (2006.01) |
| G01R 21/08 | (2006.01) |
| G01R 15/20 | (2006.01) |
| H04W 88/02 | (2009.01) |
| G06F 1/32 | (2006.01) |
| H04M 19/04 | (2006.01) |

(52) U.S. Cl.
CPC ........... *G01R 21/08* (2013.01); *G01R 15/207* (2013.01); *G06F 1/3209* (2013.01); *H04M 19/047* (2013.01); *H04W 88/02* (2013.01)

(58) Field of Classification Search
CPC ..... G01R 21/08; G01R 15/207; G06F 1/3209; H04M 19/047; H04W 88/02
See application file for complete search history.

(56) References Cited

U.S. PATENT DOCUMENTS

| | | | | | |
|---|---|---|---|---|---|
| 4,689,752 | A | * | 8/1987 | Fernandes | G01K 1/024 340/538 |
| 4,709,339 | A | * | 11/1987 | Fernandes | G01K 1/024 324/127 |
| 4,777,381 | A | * | 10/1988 | Fernandes | G01K 1/024 307/129 |

(Continued)

OTHER PUBLICATIONS

IBM, List of IBM Patents or Patent Applications Treated as Related, Appendix P, dated , 2 pages.

(Continued)

*Primary Examiner* — Joseph Feild
*Assistant Examiner* — Rufus Point
(74) *Attorney, Agent, or Firm* — David Zwick (57) ABSTRACT

A personal mobile system for detecting unsafe electrical power levels. Magnetic sensors detect a magnitude of a magnetic field produced by a power line. A GPS determines the location of the detected the magnetic field. A distance from the location of the detected the magnetic field is determined. In response to determining that the magnitude of the detected magnetic field produced by the power line exceeds the stored electrical power level threshold, based on the determined distance, an alert module produces an alert on the personal mobile system.

1 Claim, 6 Drawing Sheets

(56) References Cited

U.S. PATENT DOCUMENTS

| | | | | |
|---|---|---|---|---|
| 4,818,990 A * | 4/1989 | Fernandes | | G01R 15/14 340/12.32 |
| 4,904,996 A * | 2/1990 | Fernandes | | G01R 15/142 340/601 |
| 6,329,924 B1 * | 12/2001 | McNulty | | G01R 29/0857 340/552 |
| 6,788,215 B1 * | 9/2004 | White | | G08B 21/02 340/657 |
| 8,275,413 B1 | 9/2012 | Fraden et al. | | |
| 8,384,548 B2 | 2/2013 | Knopf et al. | | |
| 8,575,942 B2 | 11/2013 | Dorr et al. | | |
| 8,744,113 B1 | 6/2014 | Rickards | | |
| 8,786,447 B1 | 7/2014 | Wise | | |
| 9,494,632 B1 | 11/2016 | McNulty | | |
| 9,881,416 B2 * | 1/2018 | Priest | | G06T 17/05 |
| 2005/0107133 A1 * | 5/2005 | Yin | | H04M 1/72502 455/573 |
| 2005/0162148 A1 | 7/2005 | Staats | | |
| 2005/0264427 A1 | 12/2005 | Zeng et al. | | |
| 2007/0089311 A1 * | 4/2007 | Amundson | | G01C 17/28 33/355 R |
| 2008/0106425 A1 * | 5/2008 | Deaver | | G01R 19/16547 340/646 |
| 2012/0253538 A1 | 10/2012 | Raymond | | |
| 2013/0241746 A1 * | 9/2013 | McKinley | | G01D 4/002 340/870.02 |
| 2014/0274114 A1 * | 9/2014 | Rowitch | | G01S 19/46 455/456.1 |
| 2014/0343878 A1 | 11/2014 | Gudmundsson et al. | | |
| 2015/0091735 A1 | 4/2015 | McNulty | | |
| 2015/0153151 A1 | 6/2015 | Kochanski | | |
| 2016/0080035 A1 * | 3/2016 | Fuchs | | H01P 3/16 375/257 |
| 2017/0356989 A1 * | 12/2017 | Van Fleet | | G01S 13/10 |
| 2017/0373720 A1 * | 12/2017 | Henry | | H04B 5/0018 |
| 2018/0024205 A1 * | 1/2018 | Kim | | G01R 31/40 |

OTHER PUBLICATIONS

Pending U.S. Appl. No. 15/075,488, filed Mar. 21, 2016, entitled: "Automatic Measurement and Notification of Electrical Level Using Smartphone Sensors", 29 pages.

HD Electric Company, "Personal Voltage Detectors," HD Electric Products, © 2009, HD Electric Company, pp. 1-6.

HD Electric Company, "New Proximity Voltage Detector," HD Electric Products, © 2009 HD Electric Company, pp. 1-3.

Mell et al., "The NIST Definition of Cloud Computing", National Institute of Standards and Technology, Special Publication 800-145, Sep. 2011, pp. 1-7.

* cited by examiner

AUTOMATIC MEASUREMENT AND NOTIFICATION OF ELECTRICAL LEVEL USING SMARTPHONE SENSORS

BACKGROUND

The present invention relates generally to the field of electrical measurements, and more particularly to the measurement of nearby electrical and magnetic fields using sensors on a computing device.

As provided by the Electrical Safety Foundation International (ESFI), "Contact with Overhead Power Lines" (including direct worker contact and contact through machines, tools, and hand-carried metallic objects) was the largest fatal accident category comprising 44% of all electrical fatalities for the period 1992-2010. "Contact with Wiring, Transformers, or Other Electrical Components" (most common for workers who install, repair, or maintain electrical systems and apparatus in the normal course of their electrical work) was the second-largest fatal injury category with 27% of all fatalities, followed by "Contact with Electric Current of Machine, Tool, Appliance, or Light Fixture" (most common for workers who use electrical tools and apparatus in the normal course of their non-electrical work) with 17%.

Five occupational groups account for nearly 80% of all fatal electrical accidents. "Construction Trades Workers" represent about 38% of all electrical fatalities. Other occupational groups with high numbers of electrical fatalities are "Installation, Maintenance, and Repair Occupations" (21%), "Other Management Occupations" (4%), and "Agricultural Workers" (2%). The Construction industry experienced 52% of total electrical fatalities.

SUMMARY

Embodiments of the present invention disclose a personal mobile system for detecting unsafe electrical power levels. One or more computer processors are operatively coupled to one or more computer-readable storage media, a magnetic sensor, a GPS module, a wireless network interface, and an alert module. Electrical power level thresholds and locations of power lines are stored on the one or more computer-readable storage media. The magnetic sensor is operated to detect a magnitude of a magnetic field produced by a power line. The GPS is operated to determine the location at which the magnetic sensor detected the magnetic field produced by the power line. The one or more processors are operated to determine a distance from the determined location at which the magnetic sensor detected the magnetic field produced by the power line and the power line. The one or more processors are further operated to determine if the magnitude of the detected magnetic field produced by the power line exceeds the stored electrical power level threshold, based on the determined distance from the location at which the magnetic sensor detected the magnetic field produced by the power line and the power line. In response to the one or more processors determining that the magnitude of the detected magnetic field produced by the power line exceeds the stored electrical power level threshold, the one or more processors cause the alert module to produce an alert on the personal mobile system.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques to those skilled in the art may be omitted to avoid unnecessarily obscuring the presented embodiments.

References in the specification to "one embodiment", "an embodiment", "an exemplary embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present invention relates generally to the field of electrical measurements, and more particularly to the measurement of electrical and magnetic fields (also referred to as "electrical power levels") from nearby electrical lines using sensors on a personal computing device. Typically, an electrical worker can use stand-alone devices such as, for example, fluorescent electrical field detectors, contact voltage detectors, or hall-effect sensors to measure nearby electrical power levels. Typically, electrical workers need to manually use the stand-alone devices to measure nearby electrical power levels (i.e., the stand-alone devices need to receive a user input to collect electrical data). It would be advantageous for an electrical worker to be automatically notified of nearby power levels without the need to manually interact with an electrical measurement device. Furthermore, if the electrical worker is close to, or working directly with, electrical power lines outside of his or her certification level, a supervisor would be automatically notified of the situation. One way to detect electrical power levels and to alert the appropriate parties is to utilize one or more sensors on personal computing devices (e.g., smartphones) carried by the electrical worker. The term "electrical worker" as used herein, may refer to any person working directly with, or near to, power lines and is not limited to professional electrical workers (i.e., electricians).

Figure 1:
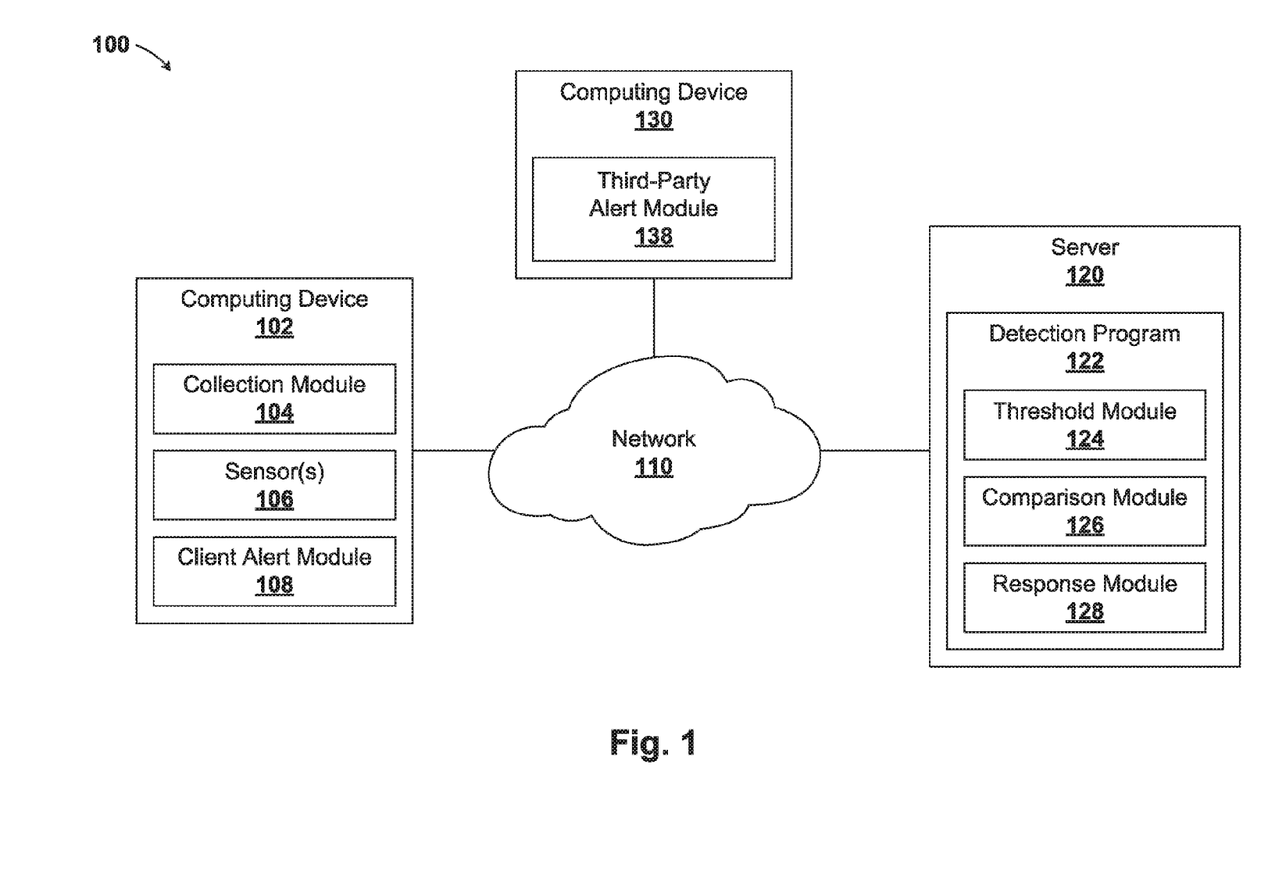
FIG. 1 is a functional block diagram illustrating a computer network environment, according to an exemplary embodiment.

FIG. 1 is a functional block diagram of an electrical power level detection environment 100, according to an embodiment of the invention. The electrical power level detection environment 100 includes server 120, computing device 102, and computing device 130 connected via network 110.

Network 110 can be, for example, a local area network (LAN), a wide area network (WAN) such as the Internet, or a combination of the two, and can include wired, wireless, or fiber optic connections. In general, network 110 can be any combination of connections and protocols that will support communications between server 120 and computing devices 102 and 130, in accordance with an embodiment of the invention.

Server 120 may be a mainframe server computer system such as a management server, a web server, or a computing device such as a laptop computer, tablet computer, netbook computer, personal computer (PC), a desktop computer, a personal digital assistant (PDA), a smartphone, a SMS capable phone, or any programmable electronic device capable of communicating with computing devices 102 and 130 via network 110, in accordance with one or more embodiments of the invention. Server 120 can also represent a "cloud" of computers interconnected by one or more networks, where server 120 may be a primary server for a computing system utilizing clustered computers when accessed through network 110.

In an embodiment, server 120 includes detection program 122, which is a collection of machine readable instructions and data that is used to receive, analyze, and send alerts regarding electrical power levels near a computing device carried by an electrical worker (and by extension, electrical power levels near the electrical worker). Detection program 122 can use a comparison module 126 and a threshold module 124 to determine a type of work zone that the electrical worker is working in by receiving electrical data from the computing device carried by the electrical worker and comparing the electrical data to threshold levels. Detection program 122 can use response module 128 to alert appropriate parties (e.g., the electrical worker or a supervisor) of the type of work zone by sending alerts to one or more computing devices carried by the appropriate parties.

Threshold module 124 is a collection of machine readable instructions and data that is used to receive or generate one or more threshold levels, in accordance with one or more embodiments of the invention. The threshold levels may be user defined, preset, or generated by threshold module 124. For example, if a supervisor has three classes of electrical workers working under him or her, the supervisor can set three threshold levels including: safe for all electrical workers, safe for certified electrical workers, and hazardous for all workers. In an alternative embodiment, the threshold levels can be received or generated by threshold module 124 by retrieving safety information from online sources such as OSHA or the Department of Labor. The threshold levels may represent electrical power levels or a range of electrical power levels, such as, for example, electrical current or voltage levels.

Comparison module 126 is a collection of machine readable instructions and data that is used to receive electrical power level data from a computing device carried by an electrical worker and to compare the electrical data to the threshold levels set by threshold module 124, in accordance with one or more embodiments of the invention. Comparison module 126 can receive and analyze the electrical power level data in real-time (i.e., continuously receiving and immediately comparing electrical power level data to threshold levels). The electrical power level data may include information gathered by the computing device regarding nearby and surrounding electrical power levels measured using sensors on the computing device.

For example, an electrical worker may be in a structure with low power levels, while high-voltage power lines may be 200 yards away from the structure. In this example, the electrical power level data collected by the sensors of the computing device carried by the electrical worker may include information regarding the low power levels of the structure as well as the distance and power levels of the high-voltage power lines. Comparison module 126 can compare the received power level data to the threshold levels, where, for example, the low power levels may fall in a safe work zone threshold level and the high-voltage power lines may fall in a hazardous work zone threshold level.

In some situations the threshold levels may be dependent on the classification of the electrical worker, for example, where a supervisor sets three classification levels for electrical workers. Comparison module 126 can determine which threshold level(s) should be used for comparison by determining the classification of the electrical worker via the computing device transmitting the electrical power level data. Comparison module 126 can determine the classification of the computing device (i.e., the electrical worker in possession of the computing device) by matching an IP address of the transmitting computing device to an assigned classification for that IP address. Another possible classification determination may be by way of the electrical worker inputting his or her credentials into the transmitting computing device.

After the electrical power level data is compared, comparison module 126 can send compared data to response module 128 for a determination of whether or not to send an alert to the appropriate parties. The compared data may include the electrical power level data and applicable threshold levels.

Response module 128 is a collection of machine readable instructions and data that is used to receive and analyze the compared data from comparison module 126 to determine whether or not to alert the appropriate parties, in accordance with one or more embodiments of the invention. Response module 128 can alert the appreciate parties by sending the alert to one or more computing devices carried by the appropriate parties. The determination of whether or not to send an alert can be based on meeting alert criteria. The alert criteria can be based on, for example, threshold levels, user defined criteria, or predetermined criteria. In another embodiment, an alert may be sent regardless of the type of electrical power level data or compared data, such that the alert is used as a real-time update of working conditions.

For example, an alert may be sent to the appropriate parties to confirm an electrical worker is in a safe zone and/or to alert the appropriate parties of the proximity to a hazardous zone. The appropriate parties may include, for example, an electrical worker in possession of computing device 102 having collection module 104, sensor(s) 106, and client alert module 108 and a supervisor in possession of computing device 130 having third-party alert module 138. In an embodiment, computing devices 102 and 130 may be smartphones, personal digital assistants (PDA's), SMS capable phones, laptop computers, tablet computers, or any programmable electronic devices capable of communicating with server 120 via network 110. In an embodiment where computing device 102 is the computing device measuring the electrical power levels, computing device 102 has at least sensor(s) 106.

Collection module 104 may be a collection of machine readable instructions and data that is used to collect electrical power level data using sensor(s) 106. The electrical power level data may include electrical power levels emitted by power lines or any other electrical components near computing device 102 as detected by sensor(s) 106. Collection module 104 can send the collected electrical power level data to comparison module 126 for analysis, as discussed above.

In an embodiment, computing device 102 is a smartphone having sensor(s) 106 including factory installed sensors, such as a magnetic sensor, GPS, accelerometer, and/or gyroscope. Each sensor provided with computing device 102 may provide improvements in power level measurements or detection sensitivity.

For example, a magnetic sensor can determine the presence and strength of a magnetic field created by a power line. The magnetic sensor may utilize solid state technology to create a miniature Hall-effect sensor that detects the Earth's magnetic field in three-dimensions. The Hall-effect sensor produces voltage which is proportional to the strength and polarity of the magnetic field along the axis in which each sensor is oriented. The sensed Hall-effect voltage is converted to a digital signal representing the magnetic field intensity. The magnetic field intensity can then be compared to magnetic fields of nearby power lines detected by the magnetic sensor. Other technologies used for magnetometer may include magneto resistive devices which change the measured resistance based on changes in the magnetic field. The magnetic sensor can also detect relative orientation of the smartphone relative to the Earth's magnetic north.

A GPS can determine the location of computing device 102 when an electrical power level is detected by the magnetic sensor using geographical location information received from GPS satellites. The GPS location can aid collection module 104 in further defining distances to known power levels (e.g., high voltage power lines having a set GPS location). Additionally, the GPS can aid collection module 104 in determining a change in location as computing device 102 is moving from one location to another.

An accelerometer and gyroscope can improve sensitivity as computing device 102 moves throughout a workspace. An accelerometer can measure proper acceleration (i.e., g-force) or coordinate acceleration (i.e., rate of change in velocity). An accelerometer can be used as a pedometer to measure distance walked by an electrical worker by detecting the motion of the workers hands or hips. Additionally, an accelerometer can help correct raw magnetic measurements collected by a magnetic sensor by comparing device tilt information to the changing Earth's magnetic field relative to each axis of the three-dimensional mapping. A gyroscope is a spinning wheel or disc where the axis of rotation is free to assume any orientation by itself. When rotating the computing device having the gyroscope, the orientation of this axis is unaffected by tilting or rotation of the computing device. In some cases, an accelerometer can be paired with a gyroscope to create, for example, a 6-axis motion sensing capability (e.g., in $4^{th}$ generation Apple® devices).

As discussed above, the electrical power level data collected by collection module 104 may be sent to comparison module 126 to generate compared data, which is then sent to response module 128 to alert the appropriate parties of current working conditions near the electrical worker based on the alert criteria. Response module 128 can send the alert(s) to client alert module 108 and/or third-party alert module 138. When an alert is received by client alert module 108 or third-party alert module 138, the computing device users (e.g., electrical worker and supervisor, respectively) can be notified, for example, by way of a ringing or vibration function. The type of notification can be defined by the type of notification functions on computing devices 102 and 130 and the nature of the alert sent by response module 128. For example, a single vibration may be used to alert the appropriate parties that the electrical worker is in a safe zone but that a hazardous zone is nearby. Alternatively, a constant vibration may be used to alert the appropriate parties that the electrical worker is in a hazardous work zone.

It should be noted, detection program 122 and each of the modules described above may be located on server 120, computing devices 102 and 130, or on any other device capable of communication via network 110. Additionally, server 120 and computing devices 102 and 130 may include internal and external hardware components, as described in reference to FIG. 4.

Figure 2:
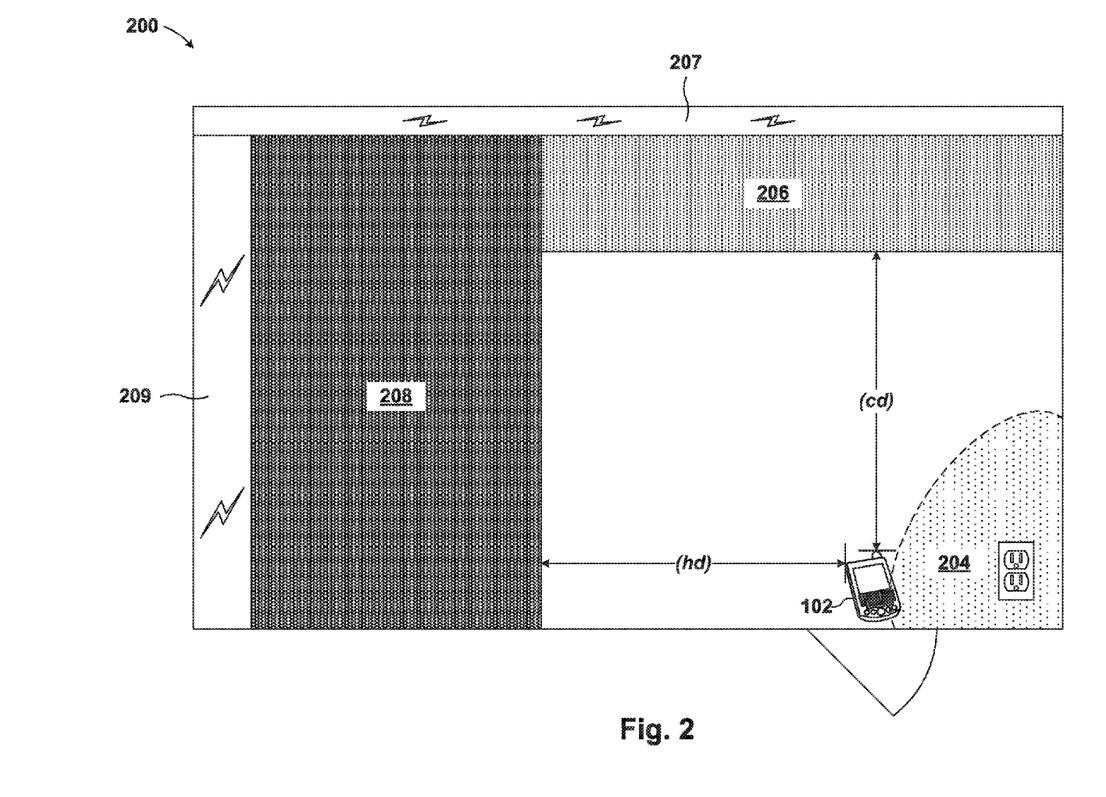
FIG. 2 is an exemplary work space for an electrical worker, according to an exemplary embodiment.

FIG. 2 is an exemplary work space 200 for an electrical worker, according to an embodiment. For example, the electrical worker may be carrying computing device 102 having sensor(s) 106, described above in reference to FIG. 1. As the electrical worker (i.e., computing device 102) enters work space 200, computing device 102 can collect electrical power level data of the work space 200 using sensor(s) 106 and can send the electrical power level data to comparison module 126. In the illustrated embodiment, three threshold levels may be set by threshold module 124 including safe zone 204, certification zone 206 defined by power line 207, and hazardous zone 208 defined by power line 209. Sensor(s) 106 on computing device 102 can collect the electrical power level data including the distance to the certification zone (cd) and the distance to the hazardous zone (hd). As the electrical worker moves through work space 200, the sensor(s) 106 of computing device 102 can send updates to comparison module 126 to keep track of the real-time working conditions and location.

In some situations, power lines or devices may not be on at the time of data collection by collection module 104, however, comparison module 126 may also set potential threshold zones. For example, if power line 209 is currently off, comparison module 126 may receive information identifying the location of power line 209 (e.g., via GPS locations of known power lines) and may create a potential hazardous zone mirroring hazardous zone 208. Response module 128 can treat potential work zones the same as live work zones (e.g., hazardous zone 208) when determining whether or not to send alerts. Alternatively, response module 128 can alert the appropriate parties in a way to convey the presence of a potential work zone rather than a live work zone.

Figure 3:
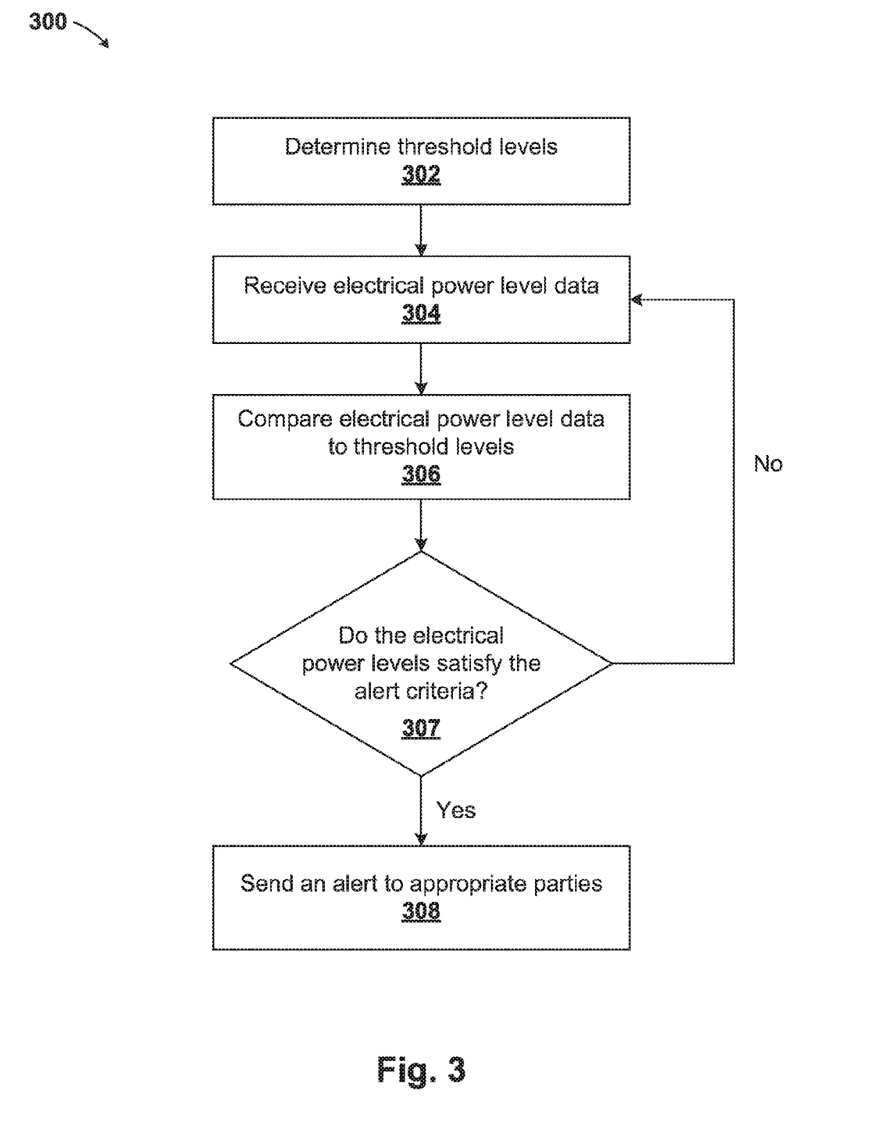
FIG. 3 is an alert determination flowchart depicting the operational steps of a detection program, according to an exemplary embodiment.

FIG. 3 is an alert determination flowchart 300 depicting operations steps of detection program 122, according to an exemplary embodiment. Threshold module 124 determines the number and value of a threshold level(s) (Step 302). Comparison module 126 receives electrical power level data including power levels near an electrical worker (via a computing device having sensor(s) carried by the electrical worker) (Step 304). Comparison module 126 compares the electrical power level data to the threshold levels and generates compared data (Step 306). Response module 128 determines whether the compared data satisfies alert criteria (Step 307). If the alert criteria is not satisfied, steps 304, 306, and 307 may be performed again when more electrical power level data is received (e.g., real-time data updates). If the alert criteria are satisfied, response module 128 alerts the appropriate parties (Step 308).

Figure 4:
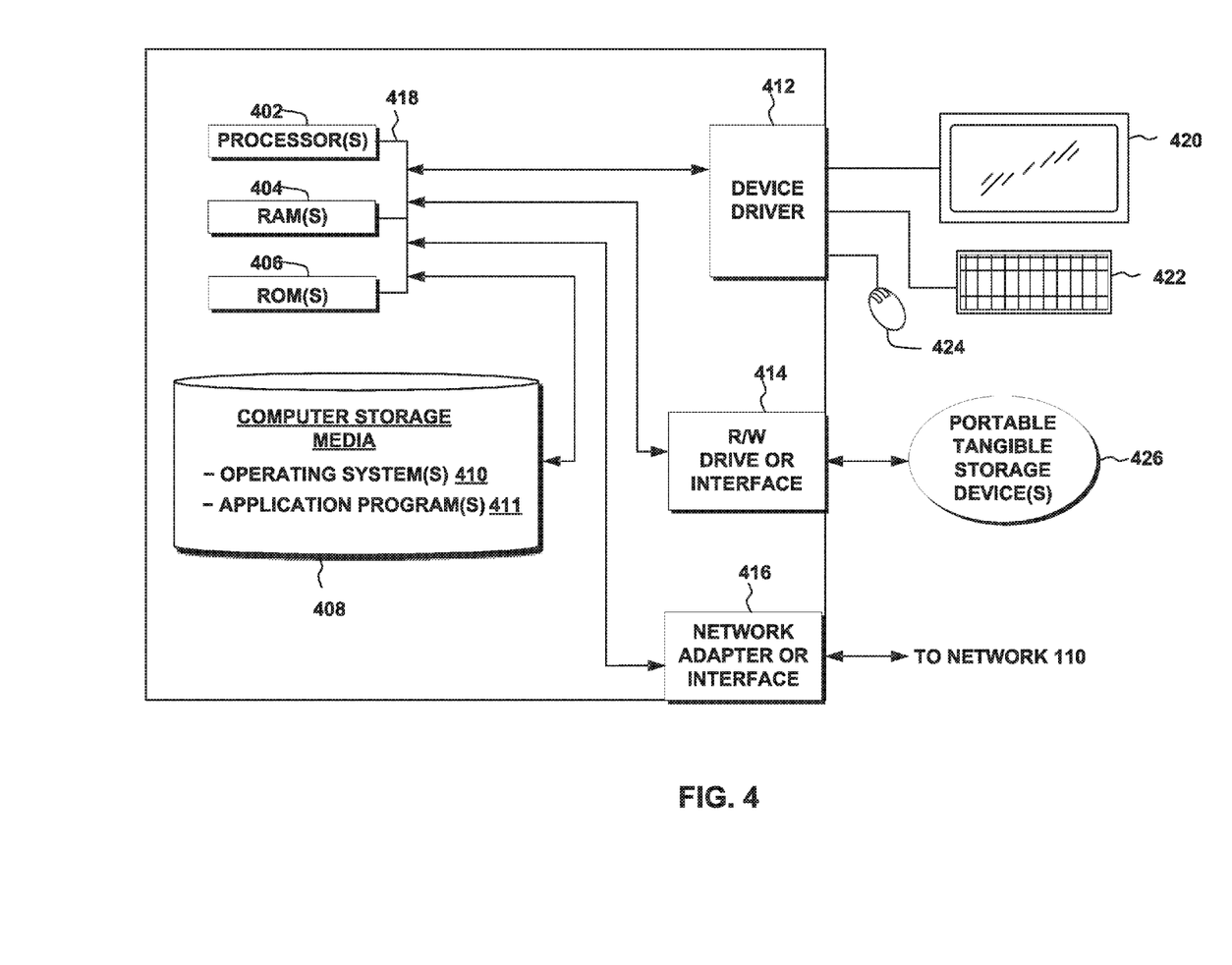
FIG. 4 is a block diagram of components of a server or computing device executing the detection program, according to an exemplary embodiment.

FIG. 4 is a block diagram of components of the server 120 and/or computing device 102 and 130, in accordance with an illustrative embodiment of the present invention.

Server 120 may include one or more processors 402, one or more computer-readable RAMs 404, one or more computer-readable ROMs 406, one or more computer readable storage media 408, device drivers 412, read/write drive or interface 414, network adapter or interface 416, all interconnected over a communications fabric 418. Communications fabric 418 may be implemented with any architecture designed for passing data and/or control information between processors (such as microprocessors, communications and network processors, etc.), system memory, peripheral devices, and any other hardware components within a system.

One or more operating systems 410, and one or more application programs 411, for example, determination program 122 described in reference to FIG. 1, are stored on one or more of the computer readable storage media 408 for execution by one or more of the processors 402 via one or more of the respective RAMs 404 (which typically include cache memory). In the illustrated embodiment, each of the computer readable storage media 408 may be a magnetic disk storage device of an internal hard drive, CD-ROM, DVD, memory stick, magnetic tape, magnetic disk, optical disk, a semiconductor storage device such as RAM, ROM, EPROM, flash memory or any other computer-readable tangible storage device that can store a computer program and digital information.

Server 120 may also include a R/W drive or interface 414 to read from and write to one or more portable computer readable storage media 426. Application programs 411 on server 120 may be stored on one or more of the portable computer readable storage media 426, read via the respective R/W drive or interface 414 and loaded into the respective computer readable storage media 408.

Server 120 may also include a network adapter or interface 416, such as a TCP/IP adapter card or wireless communication adapter (such as a 4G wireless communication adapter using OFDMA technology). Application programs 411 on server 120 may be downloaded to the computing device from an external computer or external storage device via a network (for example, the Internet, a local area network or other wide area network or wireless network) and network adapter or interface 416. From the network adapter or interface 416, the programs may be loaded onto computer readable storage media 408. The network may comprise copper wires, optical fibers, wireless transmission, routers, firewalls, switches, gateway computers and/or edge servers.

Server 120 may also include a display screen 420, a keyboard or keypad 422, and a computer mouse or touchpad 424. Device drivers 412 interface to display screen 420 for imaging, to keyboard or keypad 422, to computer mouse or touchpad 424, and/or to display screen 420 for pressure sensing of alphanumeric character entry and user selections. The device drivers 412, R/W drive or interface 414 and network adapter or interface 416 may comprise hardware and software (stored on computer readable storage media 408 and/or ROM 406).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 5:
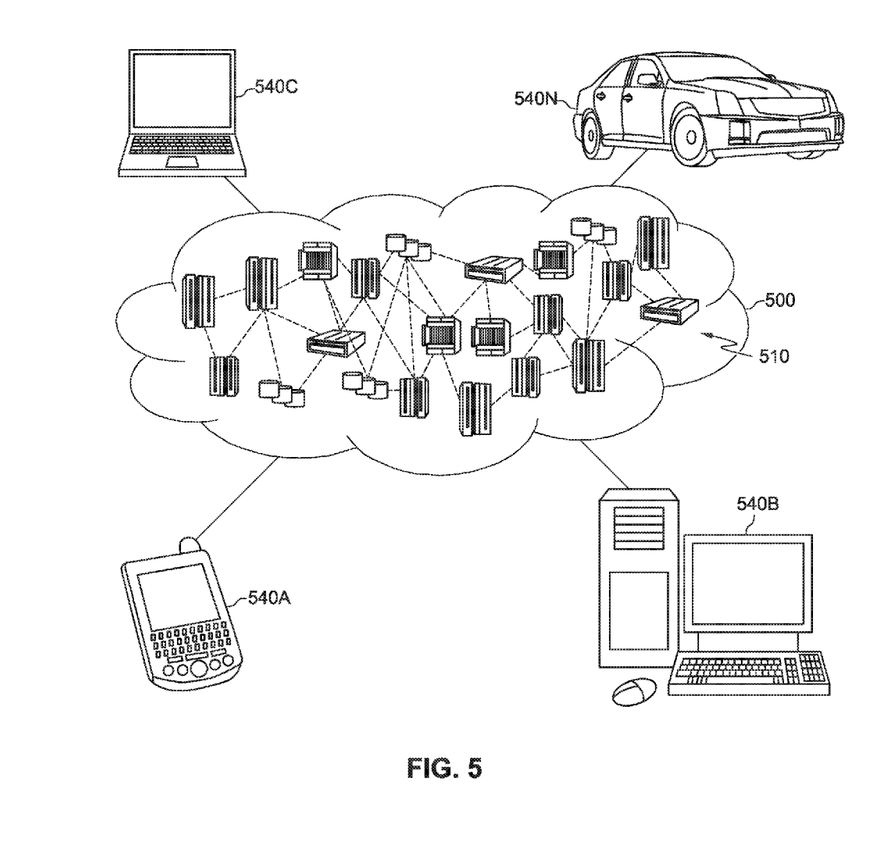
FIG. 5 depicts a cloud computing environment, according to an exemplary embodiment.

Referring now to FIG. 5, an illustration of a cloud computing environment 500 is depicted, according to an exemplary embodiment. The cloud computing environment 500 can include one or more cloud computing nodes 510 with which local computing devices used by cloud consumers, such as, for example, personal digital assistant (PDA) or cellular telephone 540A, desktop computer 540B, and/or laptop computer 540C may communicate. The nodes may be grouped (not shown) physically or virtually, in one or more networks, such as Private, Community, Public, or Hybrid clouds as described hereinabove, or a combination thereof. This allows the cloud computing environment to offer infrastructure, platforms and/or software as services for which a cloud consumer does not need to maintain resources on a local computing device. It is understood that the types of computing devices 540A-C are intended to be illustrative only and that computing nodes and the cloud computing environment can communicate with any type of computerized device over any type of network and/or network addressable connection (e.g., using a web browser).

Figure 6:
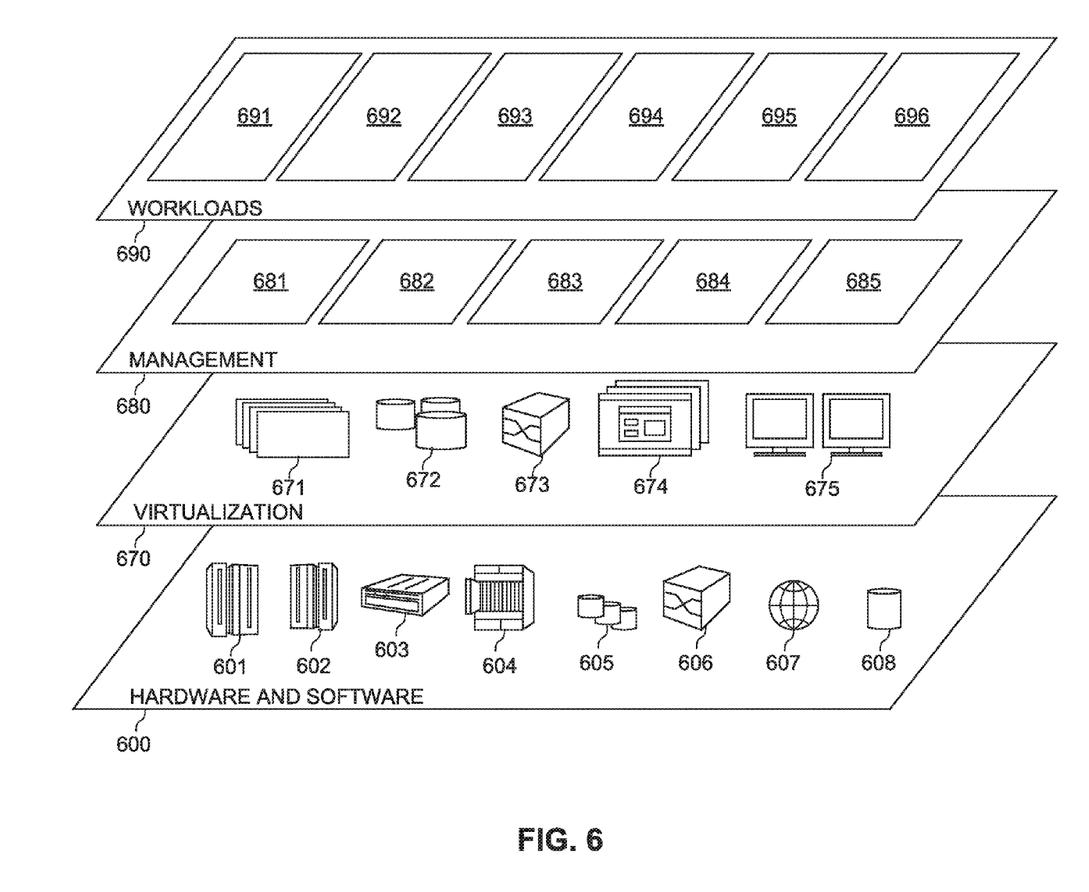
FIG. 6 depicts abstract model layers of a cloud computing environment, according to an exemplary embodiment.

Referring now to FIG. 6, a set of functional abstraction layers provided by cloud computing environment 500 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 600 includes hardware and software components. Examples of hardware components include: mainframes 601; RISC (Reduced Instruction Set Computer) architecture based servers 602; servers 603; blade servers 604; storage devices 605; and networks and networking components 606. In some embodiments, software components include network application server software 607 and database software 608.

Virtualization layer 670 provides an abstraction layer from which the following examples of virtual entities may be provided: virtual servers 671; virtual storage 672; virtual networks 673, including virtual private networks; virtual applications and operating systems 674; and virtual clients 675.

In one example, management layer 680 may provide the functions described below. Resource provisioning 681 provides dynamic procurement of computing resources and other resources that are utilized to perform tasks within the cloud computing environment. Metering and Pricing 682 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 683 provides access to the cloud computing environment for consumers and system administrators. Service level management 684 provides cloud computing resource allocation and management such that required service levels are met. Service Level Agreement (SLA) planning and fulfillment 685 provide pre-arrangement for, and procurement of, cloud computing resources for which a future requirement is anticipated in accordance with an SLA.

Workloads layer 690 provides examples of functionality for which the cloud computing environment may be utilized. Examples of workloads and functions which may be provided from this layer include: mapping and navigation 691; software development and lifecycle management 692; virtual classroom education delivery 693; data analytics processing 694; transaction processing 695; and targeted recommendation processing 696 (e.g., determination program 122).

Based on the foregoing, a computer system, method, and computer program product have been disclosed. However, numerous modifications and substitutions can be made without deviating from the scope of the present invention. Therefore, the present invention has been disclosed by way of example and not limitation.

What is claimed is:

1. A personal mobile system for detecting unsafe electrical power levels,
the personal mobile system comprising:
one or more computer processors;
one or more computer-readable storage media;
a magnetic sensor;
a GPS module;
a wireless network interface; and
an alert module;
the one or more computer processors operatively coupled to the one or more computer-readable storage media, the magnetic sensor, the GPS module, the wireless network interface, and the alert module;
the one or more computer-readable storage media having stored thereon locations of power lines, and a plurality of electrical power level thresholds, each electrical power level threshold being associated with a respective electrical worker classification level;
the magnetic sensor operated to detect a magnitude of a magnetic field produced by a power line;
the GPS operated to determine the location at which the magnetic sensor detected the magnetic field produced by the power line;
the one or more processors operated to receive inputted information from an electrical worker operating the personal mobile system indicating the electrical worker's classification level;
the one or more processors operated to determine a distance from the determined location at which the magnetic sensor detected the magnetic field produced by the power line and the power line;
the one or more processors operated to determine if the magnitude of the detected magnetic field produced by the power line exceeds the stored electrical power level threshold that is associated with the inputted electrical worker classification level, based on the determined distance from the location at which the magnetic sensor detected the magnetic field produced by the power line and the power line;

in response to the one or more processors determining that the magnitude of the detected magnetic field produced by the power line exceeds the stored electrical power level threshold that is associated with the inputted electrical worker classification level, the one or more processors causing the alert module to produce an alert on the personal mobile system.

\* \* \* \* \*